US010461180B2

(12) United States Patent
Naito

(10) Patent No.: US 10,461,180 B2
(45) Date of Patent: Oct. 29, 2019

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/015,149

(22) Filed: Jun. 21, 2018

(65) Prior Publication Data

US 2019/0027591 A1  Jan. 24, 2019

(30) Foreign Application Priority Data

Jul. 18, 2017 (JP) .................................. 2017-139452

(51) Int. Cl.
*H01L 29/739* (2006.01)
*H01L 27/07* (2006.01)
*H01L 29/861* (2006.01)
*H01L 29/417* (2006.01)
(Continued)

(52) U.S. Cl.
CPC ...... *H01L 29/7397* (2013.01); *H01L 27/0716* (2013.01); *H01L 27/0727* (2013.01); *H01L 27/0761* (2013.01); *H01L 29/0623* (2013.01); *H01L 29/41708* (2013.01); *H01L 29/8613* (2013.01); *H01L 29/407* (2013.01)

(58) Field of Classification Search
CPC ............. H01L 29/7397; H01L 29/0623; H01L 29/41708; H01L 29/8613; H01L 1127/0716; H01L 29/0727; H01L 29/0761
See application file for complete search history.

(56) References Cited

U.S. PATENT DOCUMENTS

| 2008/0012071 A1* | 1/2008 | Sapp ................... | H01L 29/0634 257/341 |
| 2010/0001344 A1* | 1/2010 | Stefanov ............. | H01L 29/0623 257/339 |

(Continued)

FOREIGN PATENT DOCUMENTS

JP  2007266133 A  10/2007
JP  2008177297 A   7/2008
(Continued)

*Primary Examiner* — Sitaramarao S Yechuri

(57) ABSTRACT

A semiconductor device including: drift regions formed on a semiconductor substrate; gate trench portions extending in predetermined extending directions from a semiconductor substrate upper surface; first and second mesa portions being in direct contact with one and the other sides of a gate trench portion side wall respectively; accumulation regions being in direct contact with the gate trench portions, above the drift regions, and having doping concentration higher than drift region concentration; a base region being in direct contact with the gate trench portions, above the accumulation regions; emitter regions being in direct contact with the one side wall of a gate trench portion on a semiconductor substrate upper surface in the first mesa portion, and having doping concentration higher than drift region concentration; and electrically floating second conductivity type floating regions provided spaced from the gate trench portion below the base region in the second mesa portion is provided.

12 Claims, 12 Drawing Sheets

(51) Int. Cl.
*H01L 29/06* (2006.01)
*H01L 29/40* (2006.01)

(56) References Cited

U.S. PATENT DOCUMENTS

| | | | |
|---|---|---|---|
| 2011/0201187 A1* | 8/2011 | Nishiwaki | H01L 29/0834 438/529 |
| 2013/0168760 A1* | 7/2013 | Hsieh | H01L 29/407 257/330 |
| 2015/0069567 A1* | 3/2015 | Yedinak | H01L 29/66712 257/493 |
| 2016/0260710 A1 | 9/2016 | Okawara et al. | |
| 2017/0162563 A1 | 6/2017 | Kameyama et al. | |
| 2018/0261666 A1* | 9/2018 | Zeng | H01L 29/42376 |

FOREIGN PATENT DOCUMENTS

| | | |
|---|---|---|
| JP | 2016039215 A | 3/2016 |
| JP | 2016164952 A | 9/2016 |

* cited by examiner

SEMICONDUCTOR DEVICE

The contents of the following Japanese patent application(s) are incorporated herein by reference:
NO. 2017-139452 filed in JP on Jul. 18, 2017.

BACKGROUND

1. Technical Field

The present invention relates to a semiconductor device.

2. Related Art

Conventionally, a semiconductor device such as an insulated gate bipolar transistor (IGBT) has been known (refer to Patent Document 1, 2, and 3 for example).

Patent Document 1: Japanese Patent Application, Publication No. 2007-266133.
Patent Document 2: Japanese Patent Application, Publication No. 2008-177297.
Patent Document 3: Japanese Patent Application, Publication No. 2016-39215.

In a semiconductor device, it is desirable to improve characteristics of turn-on loss and the like.

SUMMARY

In a first aspect of the present invention, a semiconductor device including a semiconductor substrate on which a first conductivity type drift region is formed, is provided. The semiconductor device may include a gate trench portion provided reaching from an upper surface of the semiconductor substrate to an inner part of the semiconductor substrate and provided extending in a predetermined extending direction from the upper surface. The semiconductor device may include a first mesa portion being in direct contact with one of two side walls of the gate trench portion, and a second mesa portion being in direct contact with the opposite side of the said side wall of the gate trench portion. The semiconductor device may include a first conductivity type accumulation region having doping concentration higher than that in the drift region, which is provided being in direct contact with the gate trench portion above the drift region. The semiconductor device may include a second conductivity type base region provided being in direct contact with the gate trench portion above the accumulation region. In at least the first mesa portion, the semiconductor device may include a first conductivity type emitter region having doping concentration higher than that in the drift region, which is provided on the upper surface of the semiconductor substrate such that it is in direct contact with the one side wall of the gate trench portion. The second mesa portion may be provided with electrically floating second conductivity type floating regions such that it is spaced from the gate trench portion below the base region.

Width of a second mesa portion in an array direction perpendicular to an extending direction may be larger than width of a first mesa portions in the array direction. A plurality of floating regions may be provided in the array direction. In the array direction, the plurality of floating regions may be provided at the same interval as the width of the first mesa portion.

Width of the floating region in the array direction may be equal to width of the gate trench portion in the array direction of the gate trench portions. The sum of width of a first mesa portion and width of a gate trench portion in the array direction may be equal to the sum of an interval between one floating region among the plurality of floating regions and another floating region adjacent to the one floating region in the array direction of the gate trench portion, and width of a floating region in the array direction. Among the plurality of floating regions, width of a floating region positioned on the center side of a second mesa portion in the array direction may be larger than width of a floating region closest to a gate trench portion in the array direction.

In a second mesa portion, the semiconductor device may further include a first conductivity type emitter region having doping concentration higher than that in the drift region, which is provided on the upper surface of the semiconductor substrate such that it is in direct contact with the other side wall of the gate trench portion. In the depth direction of the semiconductor substrate, the floating regions may not exist in at least a part below the emitter regions provided in the second mesa portion.

The semiconductor device may further include an interlayer dielectric film formed on the semiconductor substrate. The interlayer dielectric film may have contact holes. In the depth direction of the semiconductor substrate, the floating regions may not exist below the contact holes.

In the depth direction of the semiconductor substrate, the floating regions may be provided below the accumulation region. In the depth direction of the semiconductor substrate, the floating regions may be provided at a distance between 2.6 and 4.8 μm inclusive from the upper surface of the semiconductor substrate. In the depth direction of the semiconductor substrate, the floating regions may be provided such that the depth from lower surfaces of the floating regions to the bottom portions of the gate trench portions are less than or equal to 1.9 μm.

Note that, the summary clause does not necessarily describe all necessary features of the embodiments of the present invention. The present invention may also be a sub-combination of the features described above.

DESCRIPTION OF EXEMPLARY EMBODIMENTS

Hereinafter, although the present invention will be described through embodiments of the invention, the following embodiments shall not limit the claimed invention. Furthermore, not all the combinations of features described in the embodiments are necessarily essential to means provided by aspects of the invention.

In the present specification, one of two sides of a direction parallel with the depth direction of a semiconductor substrate is referred to as an "upper" side and the other side is referred to as a "lower" side. Between two principal surfaces of a substrate, a layer, or another member, one surface is referred to as the upper surface and the other surface is referred to as the lower surface. The "upper" and the "lower" directions are not limited by the direction of gravity or the direction of attachment to a substrate or the like at the time of implementation of a semiconductor device.

In the present specification, technical matters may be described using orthogonal coordinate axes of X-axis, Y-axis and Z-axis. In the present specification, a surface parallel with the upper surface of a semiconductor substrate is defined as an XY surface, and the depth direction of a semiconductor substrate is defined as the Z-axis.

Although a first conductivity type is N type and a second conductivity type is P type in each example shown below, the first conductivity type may also be P type, and the second conductivity type may also be N type. In this case, the conductivity type of a substrate, a layer, a region and the like in each example will have the opposite polarity respectively.

Figure 1:
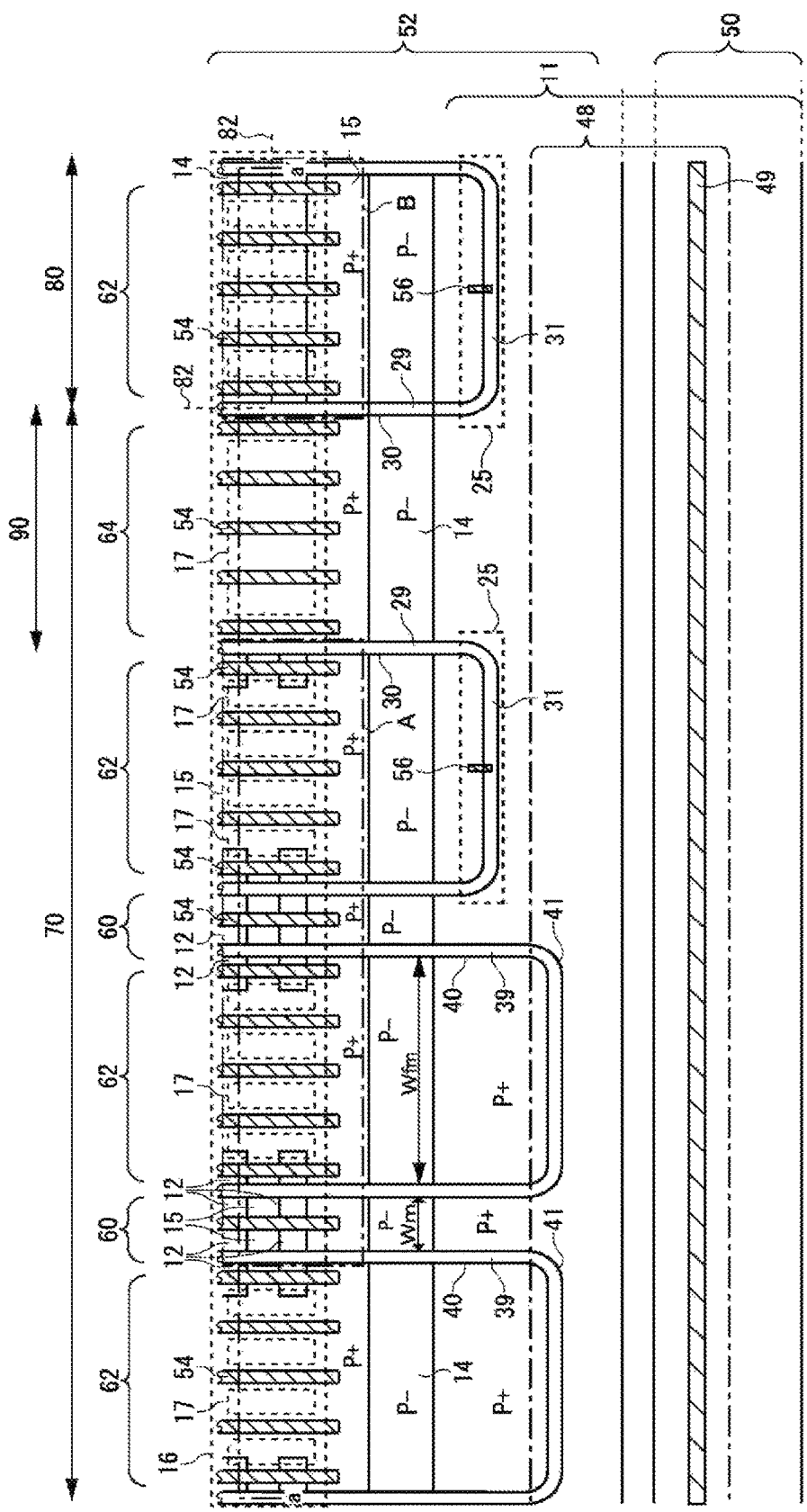
FIG. 1 is a diagram partially illustrating an upper surface of a semiconductor device 100 according to an embodiment of the present invention.

FIG. 1 is a diagram partially illustrating an upper surface of a semiconductor device 100 according to an embodiment of the present invention. The semiconductor device 100 of the present example is a semiconductor chip including a transistor portion 70 and a diode portion 80. The transistor portion 70 includes a transistor such as an IGBT. The diode portion 80 is provided being in direct contact with the transistor portion 70 on the upper surface of a semiconductor substrate and includes a diode such as FWD (Free Wheel Diode). Within the transistor portion 70, a region positioned at a boundary between the transistor portion 70 and the diode portion 80 is a boundary portion 90. In FIG. 1, an upper surface of the chip around an end portion of the chip is illustrated, and the other regions are omitted.

Also in FIG. 1, although an active region of the semiconductor substrate in the semiconductor device 100 is illustrated, the semiconductor device 100 may have an edge termination structure portion that surrounds the active region. The active region refers to a region where current flows, when the semiconductor device 100 is controlled to shift to an ON-state. The edge termination structure portion relaxes electric field concentration on the upper surface side of the semiconductor substrate. The edge termination structure portion has a structure of, for example, a guard ring, a field plate, a RESURF, or a combination thereof.

The semiconductor device 100 of the present example is provided inside the semiconductor substrate, and includes gate trench portions 40 that are exposed to the upper surface of the semiconductor substrate, dummy trench portions 30, well regions 11, emitter regions 12, base regions 14, and contact regions 15. Also, the semiconductor device 100 of the present example includes emitter electrodes 52 provided above upper surface of the semiconductor substrate, and gate metal layers 50. The emitter electrodes 52 and the gate metal layers 50 are provided to be separated from each other.

Although interlayer dielectric films are formed between the emitter electrodes 52 and the gate metal layers 50, and the upper surface of the semiconductor substrate, they are omitted in FIG. 1. Contact holes 56, contact holes 49 and contact holes 54 are formed in interlayer dielectric films of the present example, such that they pass through the interlayer dielectric films.

In addition, the emitter electrodes 52 are connected to dummy conductive portions within the dummy trench portions 30 via the contact holes 56. Connection portions 25 formed of conductive material such as polysilicon doped with impurities may be provided between the emitter electrodes 52 and the dummy conductive portions. Insulating films such as oxide films are formed between the connection portions 25 and the upper surface of the semiconductor substrate.

The gate metal layers 50 contact gate runners 48 via the contact holes 49. The gate runners 48 are formed of polysilicon doped with impurities, or the like. On the upper surface of the semiconductor substrate, the gate runners 48 are connected to gate conductive portions within the gate trench portions 40. The gate runners 48 are not connected to the dummy conductive portions within the dummy trench portions 30. The gate runners 48 of the present example are formed to reach from below the contact holes 49 to edge portions of the gate trench portions 40. Insulating films such as oxide films are formed between the gate runners 48 and the upper surface of the semiconductor substrate. At the edge portions of the gate trench portions 40, the gate conductive portions are exposed to the upper surface of the semiconductor substrate where they contact the gate runners 48.

The emitter electrodes 52 and the gate metal layers 50 are formed of metal-containing material. For example, at least a part of a region of each electrode is formed of aluminum or an aluminum-silicon alloy. Each electrode may have a barrier metal formed of titanium, a titanium compound or the like in an underlayer of a region formed of aluminum or the like, and may have a plug formed of tungsten or the like in the contact holes.

A gate trench portion 40 of the present example may have two extending portions 39 which are parallel with the upper surface of the semiconductor substrate and extend along the extending direction perpendicular to the array direction (X-axis direction in the present example), and a connecting parts 41 to connect the two extending portions 39. Preferably, at least a part of the connecting parts 41 is formed to have a curved shape. By connecting end portions of the two extending portions 39 of the gate trench portions 40, electric field concentration at the end portions of the extending portions 39 can be relaxed. At the connecting parts 41 of the gate trench portions 40, the gate runner 48 may be connected to the gate conductive portions.

The dummy trench portions 30 of the present example may be formed to have a U-shape on the upper surface of the semiconductor substrate, similar to the shape of the gate trench portions 40. In other words, the dummy trench portions 30 of the present example may have two extending portions 29 extending along the extending direction and a connecting part 31 that connects the two extending portions 29.

The emitter electrode 52 is formed above the gate trench portions 40, the dummy trench portions 30, the well region 11, the emitter regions 12, the base regions 14 and the contact regions 15. The well region 11 is a second conductivity type, and formed by a predetermined range from an end portion of the active region on the side to which the gate metal layer 50 is provided. Diffusion depth of the well region 11 may be deeper than depth of the gate trench portions 40 or the dummy trench portions 30. A part of the region of the gate trench portions 40 and a part of the region of the dummy trench portions 30, which are on the side closer to the gate metal layer 50, are formed in the well region 11. The bottom ends of the dummy trench portions 30 in the extending direction may be covered by the well region 11.

The contact holes 54 are formed above each region of the contact regions 15 and the emitter regions 12. In the diode portion 80, the contact holes 54 are formed above the contact region 15 and the base region 14. None of the contact holes 54 is arranged above the base region 14 and the well region 11 which are arranged at both ends of the first mesa portions 60 and the second mesa portions 62 in the X-axis direction.

A mesa portion is provided being in direct contact with each trench portion in the direction perpendicular to the extending direction of each trench portion in the direction parallel with the upper surface of the semiconductor substrate. The mesa portion may be a portion of the semiconductor substrate, where sandwiched by two adjacent trench portions, and may be a portion from the upper surface of the semiconductor substrate to the depth of the deepest bottom portion of each trench portion.

In the transistor portion 70, the semiconductor device 100 of the present example is provided with a first mesa portions 60 being in direct contact with one of two side walls that is parallel with the extending direction of each trench portion. In addition, the second mesa portion 62 is provided being in direct contact with the opposite side of the said side wall parallel with the extending direction of each trench portion. Floating regions 17 are provided inside the second mesa portions 62. The floating regions 17 are not provided inside the first mesa portions 60. In the top view of the semiconductor substrate in FIG. 1, regions in which the floating regions 17 are provided are illustrated with the dashed lines.

As shown in FIG. 1, the first mesa portions 60 and the second mesa portions 62 may be provided alternately in the array direction perpendicular to the extending direction of each trench portion. As one example, the base regions 14 are arranged at both end portions of each first mesa portion 60 and each second mesa portion 62 in the X-axis direction (only one of two end portions in the X-axis direction is illustrated in FIG. 1). In addition, a boundary mesa portion 64 is provided in a region of the transistor portion 70, which is in direct contact with the diode portion 80. Moreover, a first conductivity type cathode region 82 is provided in a region at the lower surface side of the semiconductor substrate of the diode portion 80. In the top view of the semiconductor substrate in FIG. 1, the region in which the cathode region 82 is provided is illustrated with the dashed lines.

The semiconductor device 100 has a first conductivity type accumulation region 16 having doping concentration higher than that in the drift region inside the semiconductor substrate, below the base region 14 such that it is in direct contact with both of the side walls of the gate trench portion 40 parallel with its extending direction. The accumulation region 16 may be arranged above the lower end of each trench portion. By providing the accumulation region 16, the carrier injection enhancement effect (IE effect) can be increased, and an ON voltage can be decreased. In FIG. 1, the area in which the accumulation region 16 is formed is illustrated with the dashed lines.

Figure 2:
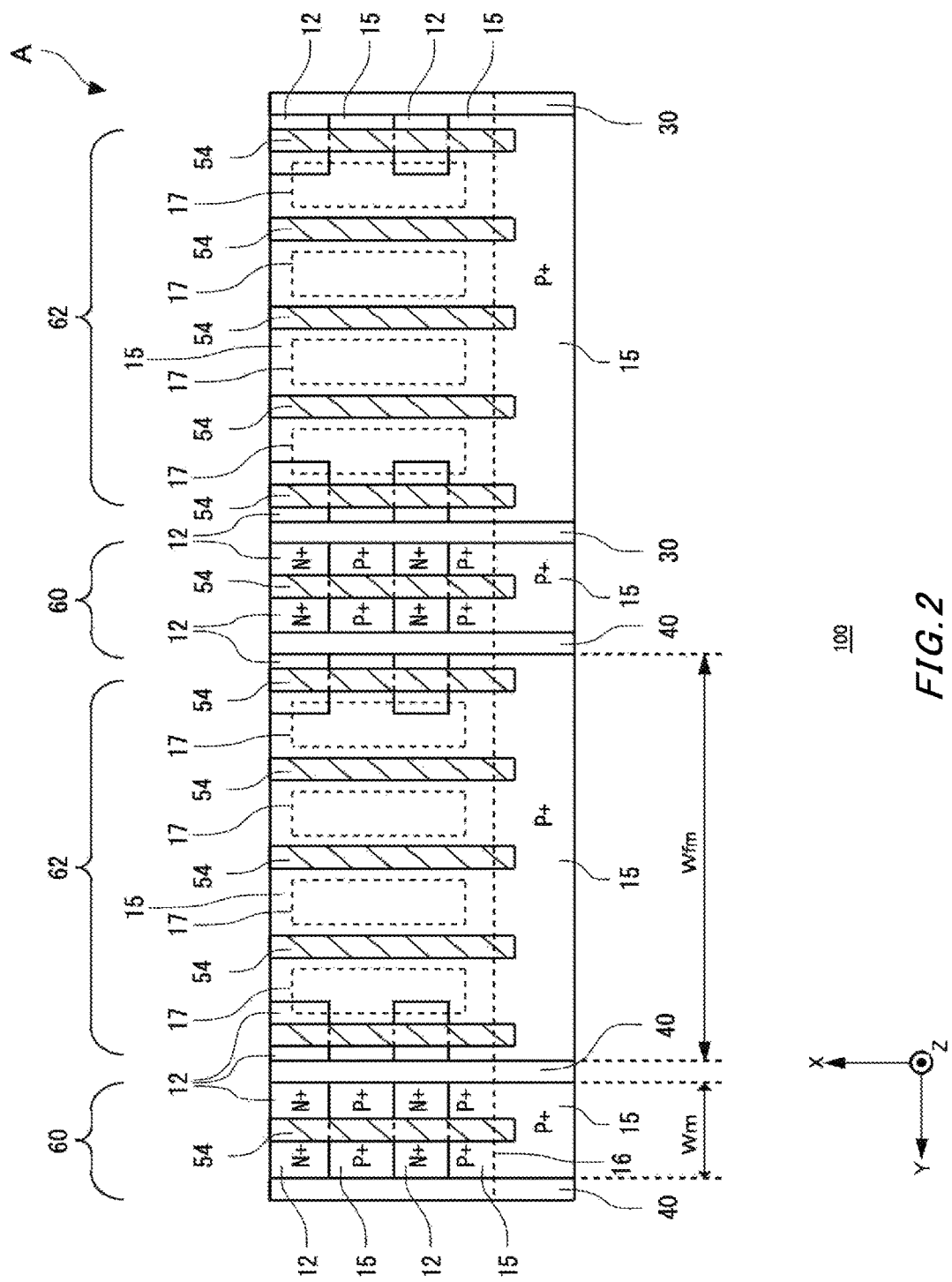
FIG. 2 is a close up view of the region A in FIG. 1.

FIG. 2 is a close up view of the region A in FIG. 1. As shown in FIG. 2, a first mesa portion 60 and a second mesa portion 62 may be provided alternately in the array direction perpendicular to the extending direction of each trench portion. In addition, an emitter region 12 and a contact region 15 may be provided alternately in the extending direction of the gate trench portion 40. Floating regions 17 are provided in the region in the dashed lines, inside a second mesa portion 62 in the top view of the semiconductor substrate. That is, in the second mesa portions 62 in the top view, the floating regions 17 are provided discretely along the Y-axis direction.

An upper surface of a first mesa portion 60 is provided with emitter regions 12 such that they are in contact with two gate trench portions 40 to sandwich the first mesa portion 60. The emitter regions 12 of the present example are N+ type. The emitter regions 12 may be formed so as to connect the two trenches. When a trench contact is formed at the lower portion of a contact hole 54, the emitter regions 12 may be formed so as to connect the trench contact and one gate trench portion 40.

In addition, the second conductivity type contact region 15 having higher doping concentration than that in the base regions 14 is optionally formed on the upper surface of the first mesa portion 60. The contact regions 15 may be formed in contact with two trenches so as to connect them. When a trench contact is formed at the lower portion of the contact hole 54, the contact region 15 may be formed so as to connect the trench contact and one gate trench portions 40. Also, the contact region 15 may be formed at the bottom portion of the trench contact.

In the first mesa portions 60, an emitter region 12 and a contact region 15 may be arranged alternately adjacent to an extending direction of a gate trench portion 40. On the upper surface of the first mesa portion 60, the emitter region 12 may be provided in contact with the dummy trench portion 30, or may be provided apart from the dummy trench portion 30. In the example of FIG. 2, the emitter regions 12 are provided in contact with the dummy trench portions 30.

The second conductivity type contact regions 15 having higher doping concentration than that in the base regions 14 are formed on the upper surfaces of the second mesa portions 62. In addition, the emitter region 12 may be provided being in direct contact with the gate trench portion 40 on the upper surface of the second mesa portion 62, although it may not be necessary. FIG. 2 is showing one example in which the emitter region 12 is provided on the upper surface of the second mesa portion 62. In a case in which the emitter region 12 is not provided on the upper surface of the second mesa portion 62, the ON voltage Von of the transistor portion 70 can be made smaller compared to a case in which the emitter region 12 is provided thereon. Moreover, on the upper surface of the second mesa portion 62, the contact region 15 may be provided in contact with the dummy trench portion 30, or may be provided apart from the dummy trench portion 30. In the example of FIG. 2, the contact region 15 is provided in contact with the dummy trench portion 30.

Width Wfm of the second mesa portion 62 in the array direction of the gate trench portion 40 of the second mesa portion 62 may be larger than width Wm of the first mesa portion 60 in the array direction of the gate trench portion 40 of the first mesa portion 60. Wfm may be twice or more of Wm. In a plane parallel with the upper surface of the semiconductor substrate, the width Wfm of the second mesa portion 62 is a width of a part of the semiconductor substrate in the Y-axis direction, where sandwiched by two trench portions that sandwich the second mesa portion 62. In a plane parallel with the upper surface of the semiconductor substrate, the width Wm of the first mesa portion 60 is a width of a part of the semiconductor substrate in the Y-axis direction, where sandwiched by the two trench portions that sandwich the first mesa portion 60. By making the width Wfm of the second mesa portion 62 larger than the width Wm of the first mesa portion 60, holes can be successfully extracted from the lower surface side of the semiconductor substrate. Thus, a tradeoff of an ON voltage and turn-off loss can have a favorable relation. Therefore, turn-on loss of the semiconductor device 100 can be suppressed.

As shown in FIG. 2, in a plane parallel with the upper surface of the semiconductor substrate, a plurality of floating regions 17 may be provided in the second mesa portion 62 in the direction perpendicular to the extending direction of the gate trench portion 40. By having more than one floating region 17, holes can be extracted more successfully from the lower surface of the semiconductor substrate. Thus, a tradeoff of an ON voltage and turn-off loss can have a more favorable relation. In addition, the dummy trench portion 30 is not formed in the second mesa portion 62. Thereby, since holes are not extracted to the emitter regions 12 from a P type inversion layer formed on the dummy trench portion 30, an increase in turn-on loss can be suppressed.

Figure 3:
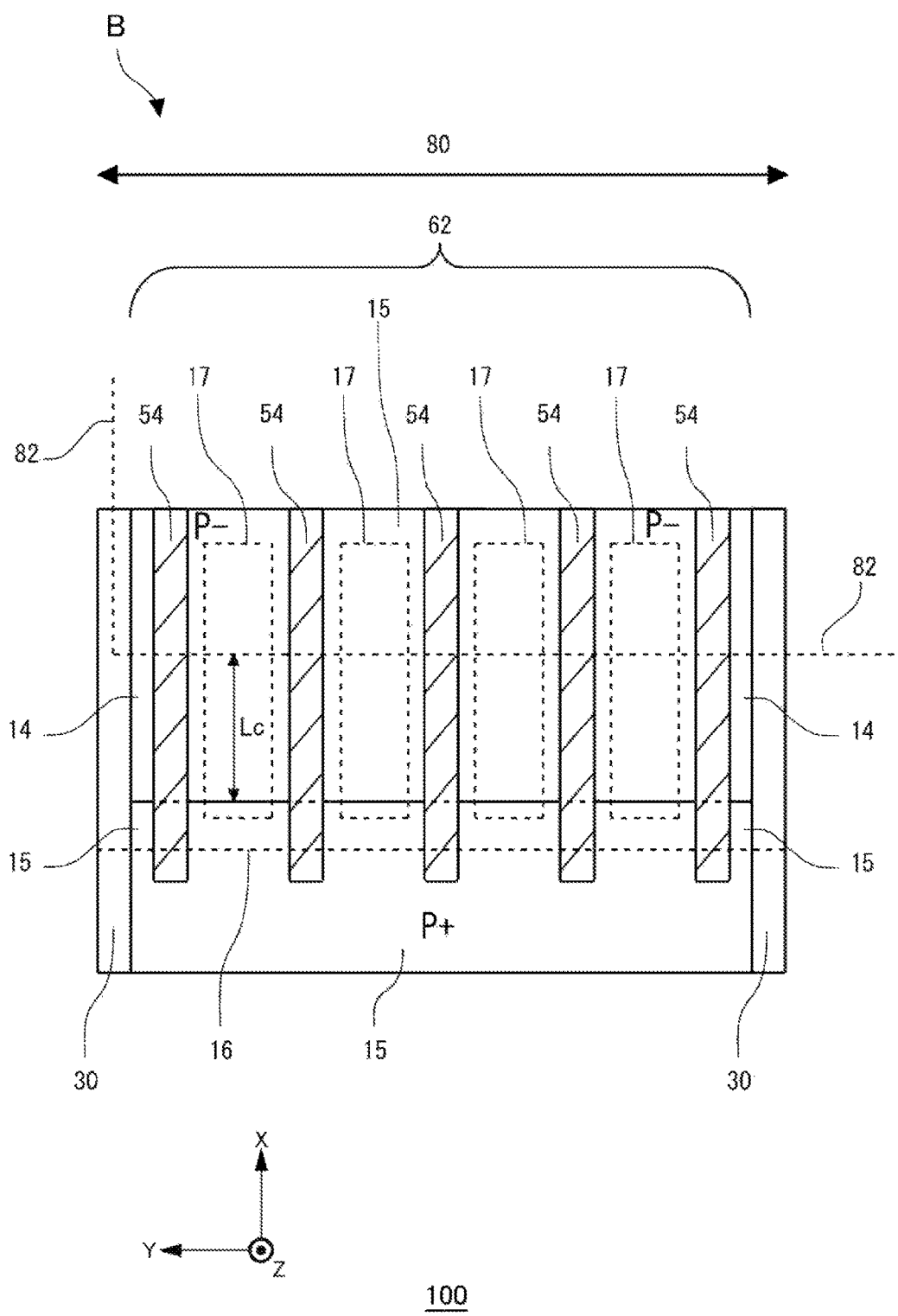
FIG. 3 is a close up view of the region B in FIG. 1.

FIG. 3 is a close up view of the region B in FIG. 1. In the diode portion 80, the semiconductor device 100 of the present example is provided with the second mesa portion 62 that is in direct contact with the dummy trench portions 30. The emitter regions 12 are not formed in the second mesa portion 62 of the diode portion 80 of the present example. The second mesa portion 62 of the diode portion 80 is sandwiched by two dummy trench portions 30, and the contact region 15 or the base region 14 is formed in the second mesa portion 62 such that it spreads from one of the dummy trench portion 30 to reach the other dummy trench portion 30. In other words, on the upper surface of the semiconductor substrate, a width of the second mesa portion 62 of the diode portion 80 in the Y-axis direction and a width of the contact region 15 or the base region 14 in the Y-axis direction, which is provided on the second mesa portion 62 of the diode portion 80, are equal.

The second mesa portion 62 of the diode portion 80 may be provided with the contact region 15 having small area to be exposed to the upper surface of the semiconductor substrate compared to that of the contact region 15 of the boundary mesa portion 64 in the transistor portion 70. As one example, the contact region 15 is provided at both end portions in the region sandwiched by the base regions 14 and in the X-axis direction, and the base regions 14 are provided in the entire region sandwiched by the contact regions 15, in the second mesa portion 62 of the diode portion 80.

In a region at the lower surface side of the semiconductor substrate, the diode portion 80 has the first conductivity type cathode region 82. In the top view of the semiconductor substrate in FIG. 3, a region in which the cathode region 82 is provided is illustrated with the dashed lines. The diode portion 80 may be a region where the cathode region 82 is projected on the upper surface of the semiconductor substrate.

The distance Lc, from a boundary of the contact regions 15 formed at both end portions in the X-axis direction and the base regions 14 to an end of the cathode region 82 projected on the upper surface, may be the diffusion length of holes or electrons, or more. Thereby, holes can be prevented from implanted excessively from the contact regions 15 to the cathode region 82 via the drift region.

Figure 4:
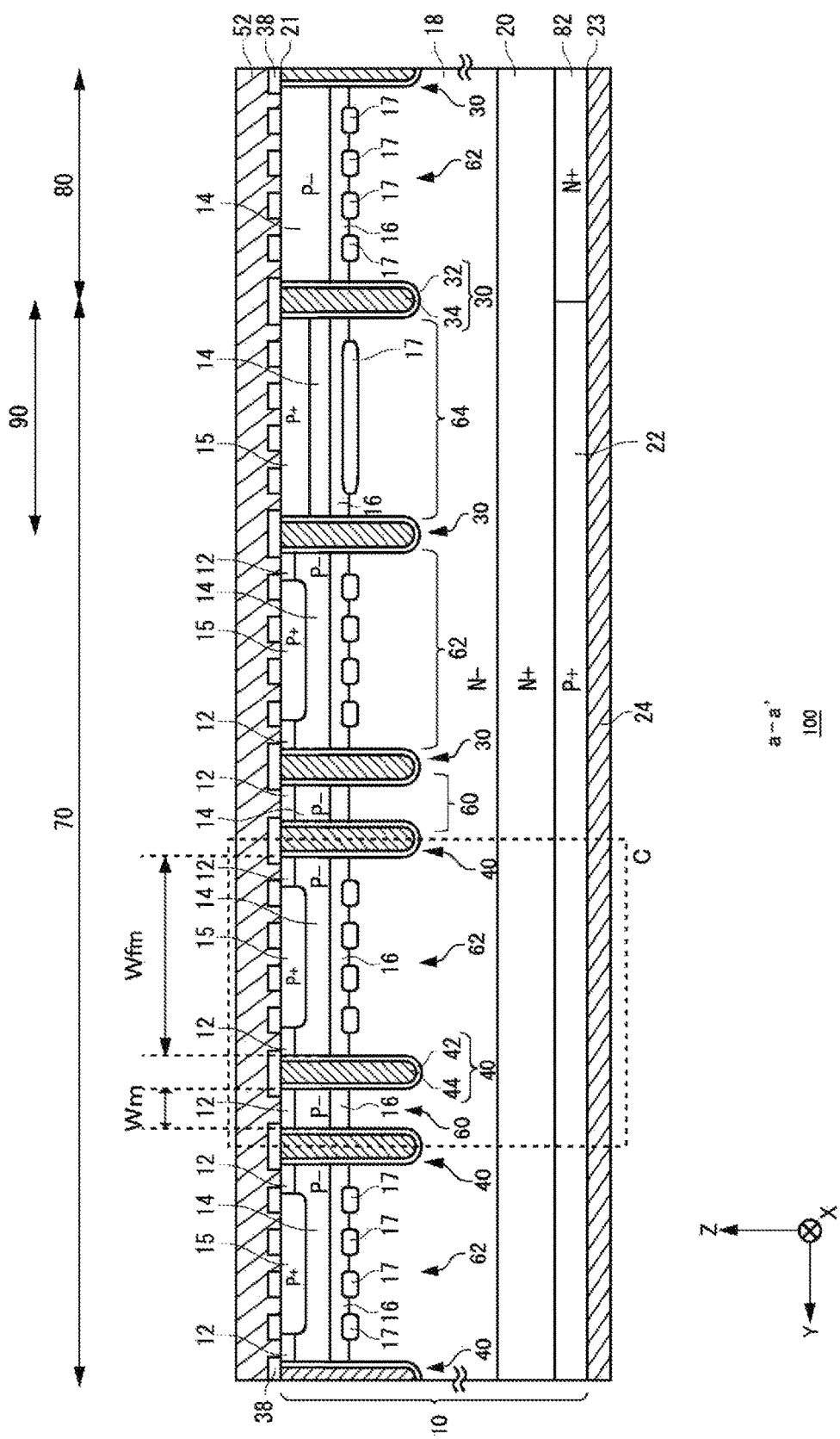
FIG. 4 is a diagram illustrating one example of a cross-section taken along a-a' in FIG. 1.

FIG. 4 is a diagram illustrating one example of a cross-section taken along a-a' in FIG. 1. In the transistor portion 70 and the diode portion 80, the a-a' cross-section is a YZ plane passing through the emitter regions 12 and the contact regions 15. In the a-a' cross-section, the semiconductor device 100 of the present example has a semiconductor substrate 10, interlayer dielectric films 38, the emitter electrode 52, and a collector electrode 24. The emitter electrode 52 is formed on the upper surface of the semiconductor substrate 10 and the interlayer dielectric films 38.

The collector electrode 24 is formed on a lower surface 23 of the semiconductor substrate 10. The emitter electrode 52 and the collector electrode 24 are formed of conductive material such as metal. In the present specification, the direction connecting the emitter electrode 52 and the collector electrode 24 is referred to as the depth direction (Z-axis direction).

The semiconductor substrate 10 may be a silicon substrate, or may be a silicon carbide substrate, or may be a nitride semiconductor substrate such as a gallium nitride substrate, or the like. The semiconductor substrate 10 of the present example is a silicon substrate. The semiconductor substrate 10 includes a first conductivity type drift region 18. The drift region 18 of the present example is N-type. The drift region 18 may be a region remained without another doping region being formed thereon.

Inside the first mesa portions 60 and the second mesa portions 62, the contact regions 15 are provided between an upper surface 21 of the semiconductor substrate 10 and the drift region 18. In the second mesa portion 62 or the boundary mesa portion 64 which are sandwiched by the dummy trench portions 30, the contact regions 15 of the present example are provided on the upper surface 21 side of the base regions 14. Also, in the first mesa portion 60 sandwiched by the gate trench portions 40, the contact region 15 is provided on the upper surface 21 side of the base region 14.

The semiconductor substrate 10 is provided with the P type base regions 14 having doping concentration lower than that in the contact regions 15 between the upper surface 21 and the drift region 18. The gate trench portions 40 and the dummy trench portions 30 are provided reaching from the upper surface 21 to the inner part of the semiconductor substrate 10 by passing through the base regions 14. In the present example, they are provided to reach the drift region 18. The base regions 14 are in contact with at least a side wall parallel with the XZ plane among the side walls of the gate trench portions 40.

In the second mesa portions 62, electrically floating second conductivity type floating regions 17 are provided below the base regions 14, such that they are spaced from the gate trench portions 40. In the first mesa portions 60, the second conductivity type floating regions 17 are not provided at the same depth as the floating regions 17 in the second mesa portions 62, below the base regions 14.

Since the dummy trench portions 30 are not formed in the second mesa portions 62, an electric field strength distribution in an OFF-state is not likely to be uniform. By discretely providing the floating regions 17 of the present example, electric field strength can be distributed uniformly, similar to the case in which the dummy trench portions 30 are formed therein, thus breakdown voltage degradation is prevented. Along the Y-axis direction, the floating regions 17 may be arranged at the same pitch as the two gate trench portions 40 that are in contact with the first mesa portion.

The base region 14 is provided to reach the upper surface 21 of the second mesa portion 62 of the diode portion 80. In addition, the second mesa portion of the diode portion 80 may not be provided with either the contact regions 15 or the emitter regions 12, on the upper surface 21 which has projected the cathode region 82.

The diode portion 80 has an N+ type cathode region 82 below a buffer region 20. The cathode region 82 may be a region provided at substantially the same depth as a collector region 22 of the transistor portion 70. Thereby, in a power inverter circuit such as an inverter, the diode portion 80 may, upon turn-off of a transistor portion 70 of another semiconductor device 100, function as a free wheeling diode (FWD) to flow free wheeling current to conduct in a reverse direction.

A collector region 22 is provided on the lower surface 23 below the boundary mesa portion 64. The collector region 22 may be an extended collector region 22 of the transistor portion 70. Because the collector region 22 is extending to reach the lower surface 23 side of the boundary mesa portion 64, distance can be maintained between the emitter regions 12 of the transistor portion 70 and the cathode region 82 of the diode portion 80. Thus, electrons implanted to the drift region 18 from a gate structure portion that includes the emitter regions 12 of the transistor portion 70 can be prevented from flowing out to the cathode region 82 of the diode portion 80. In addition, distance can be maintained between the contact regions 15 of the transistor portion 70 and the cathode region 82 of the diode portion 80. Thereby, excess holes flowing into the cathode region 82 from the contact regions 15 of the transistor portion 70 can be suppressed.

In the present example, distance can also be long between the contact region 15 of the boundary mesa portion 64 and the cathode region 82 of the diode portion 80, compared to a case in which the cathode region 82 is provided to reach directly under the boundary mesa portion 64. Thereby, when the diode portion 80 is conducted, holes can be suppressed from being implanted to the cathode region 82 from the contact region 15 having doping concentration higher than that in the base region 14.

An N+ type buffer region 20 is formed below the drift region 18 in both of the transistor portion 70 and the diode portion 80. Doping concentration of the buffer region 20 is higher than doping concentration of the drift region 18. The buffer region 20 may function as a field stop layer to prevent a depletion layer that expand from the lower surface side of base regions 14 from reaching a P+ type collector region 22 and the N+ type cathode region 82.

The P+ type collector region 22 is formed below the buffer region 20 in the transistor portion 70. The collector region 22 may extend to reach the region in the lower surface 23 side of the boundary mesa portion 64. The N+ type cathode region 82 is formed below the buffer region 20 in the diode portion 80.

One or more gate trench portions 40 and one or more dummy trench portions 30 are formed on the upper surface 21 of the semiconductor substrate 10. Each trench portion reaches the drift region 18 from the upper surface 21 through the base region 14. In a region provided with at least any one of the emitter region 12, the contact region 15 and the accumulation region 16, each trench portion also passes through these regions in order to reach the drift region 18. The phrase "trench portion to pass through a doping region" is not limited to that fabricated in the order of forming a doping region and then forming a trench portion. "Trench portion to pass through a doping region" also includes that fabricated in the order of forming trench portions and then forming a doping region between the trench portions.

The gate trench portion 40 has a gate trench, a gate insulating film 42, and a gate conductive portion 44 which are formed on the upper surface 21. The gate insulating film 42 is formed such that it covers the inner wall of the gate trench. The gate insulating film 42 may be formed by oxidizing or nitriding a semiconductor at the inner wall of the gate trench. The gate insulating film 42 is formed inside the gate trench, and the gate conductive portion 44 is formed inside the gate insulating film 42. That is, the gate insulating film 42 insulates the gate conductive portion 44 from the semiconductor substrate 10. The gate conductive portions 44 are formed of conductive material such as polysilicon.

In the depth direction, the gate conductive portion 44 include a region facing at least the adjacent base regions 14 that sandwich the gate insulating film 42. On the upper surface 21, the gate trench portions 40 in the cross section are covered by the interlayer dielectric films 38. When a predetermined voltage is applied to the gate conductive portions 44, channels formed by inversion layers of electrons are formed on interfacial surface layers of the base regions 14, where in contact with the gate trench.

In the cross section, the dummy trench portions 30 may have the same structure as that of the gate trench portions 40. The dummy trench portion 30 has a dummy trench, a dummy insulating film 32, and a dummy conductive portion 34 which are formed on the upper surface 21 side. The dummy insulating film 32 is formed such that it covers the inner wall of the dummy trench. The dummy insulating film 32 is formed inside the dummy trench and the dummy conductive portion 34 is formed inside the dummy insulating film 32. The dummy insulating film 32 insulates the dummy conductive portion 34 from the semiconductor substrate 10.

The dummy conductive portions 34 may be formed of the same material as that of the gate conductive portions 44. For example, the dummy conductive portions 34 are formed of conductive material such as polysilicon. In the depth direction, the dummy conductive portion 34 may have the length same as that of a gate conductive portion 44. On the upper surface 21, the dummy trench portions 30 in the cross section are covered by the interlayer dielectric films 38. Note that, the bottom portions of the dummy trench portions 30 and the gate trench portions 40 may have downwardly convex curved surface forms (curved line forms in the cross-section).

Figure 5:
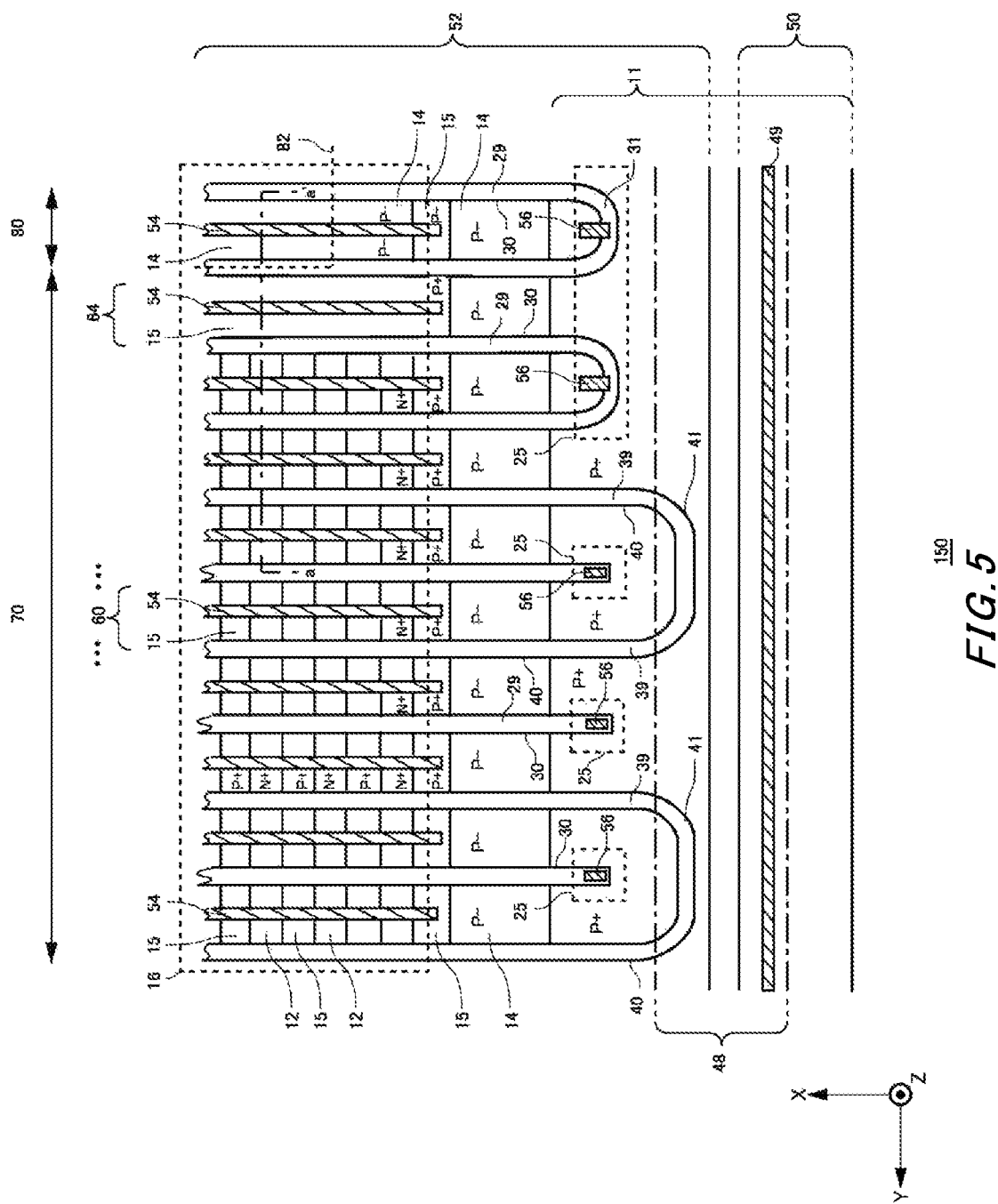
FIG. 5 is a diagram partially illustrating an upper surface of a semiconductor device 150 of a comparative example.

FIG. 5 is a diagram partially illustrating an upper surface of a semiconductor device 150 of a comparative example that does not have second mesa portions 62. In the semiconductor device 150 of the comparative example, a portion of the semiconductor substrate where sandwiched by two adjacent trench portions are configured with a first mesa portion 60.

Figure 6:
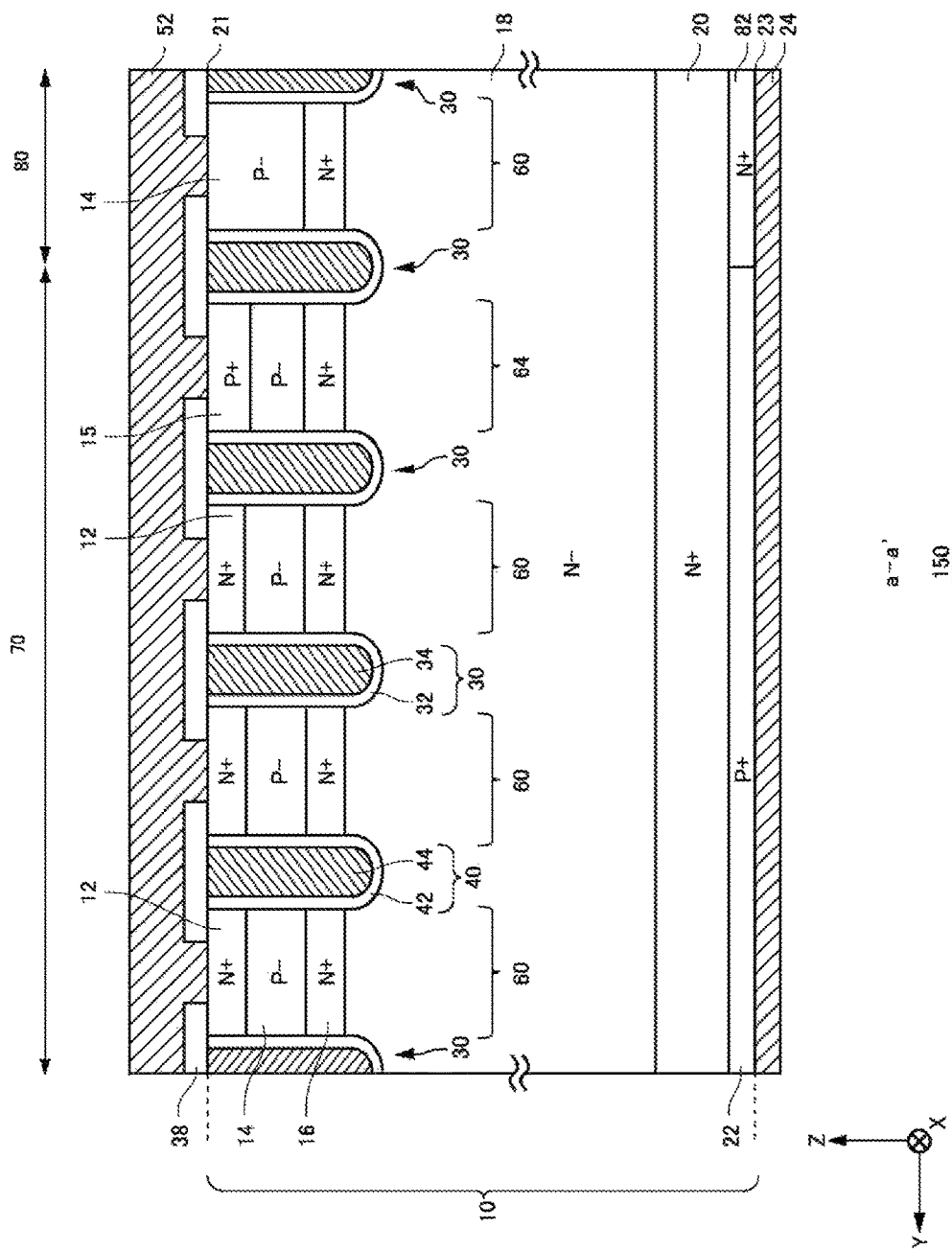
FIG. 6 is a diagram illustrating one example of a cross-section taken along a-a' in FIG. 5.

FIG. 6 is a diagram illustrating one example of a cross-section taken along a-a' in FIG. 5. In the semiconductor device 150 of the comparative example, none of the first mesa portions 60 has floating regions 17.

The semiconductor device 150 of the comparative example in FIG. 6 is provided with dummy trench portions 30 adjacent to a gate trench portion 40. Therefore, when the semiconductor device 150 is turned on, a P type inversion layers occur at the bottom portions of the dummy trench portions 30. When the semiconductor device 150 is turned on, holes are extracted to emitter regions 12 from this P type inversion layers. Thus, turn-on loss becomes large. The semiconductor device 100 of the present example in FIG. 4 is provided with the floating region 17 adjacent to the gate trench portion 40. Since this floating region 17 exists, holes can be successfully extracted from the lower surface 23 side of the semiconductor substrate 10. Thus, a tradeoff of an ON voltage and turn-off loss can have a favorable relation. In addition, since the dummy trench portion 30 does not exist at a position of the floating region 17, turn-on loss caused by holes being extracted to the emitter region 12 from this P type inversion layer can be suppressed.

Figure 7:
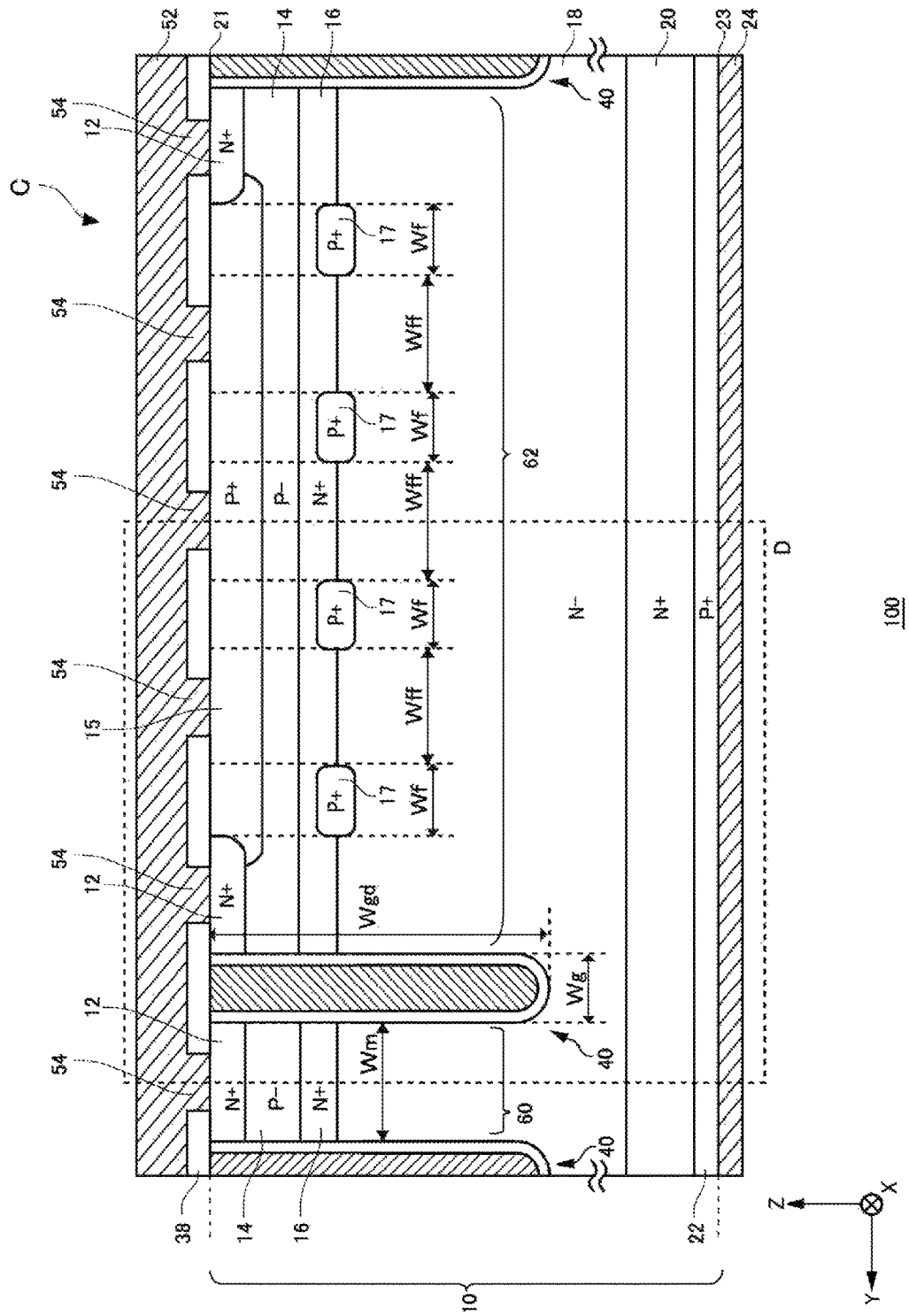
FIG. 7 is a close up view of the region C in FIG. 4.

FIG. 7 is a close up view of the region C surrounded by the dashed lines in FIG. 4. As shown in FIG. 7, in the direction parallel with the upper surface 21, an interval Wff between the adjacent floating regions 17 in the Y-axis direction may be equal to a width Wm of the first mesa portion 60. Here, being equal may include being within 10% of an error range. In the present specification, if the phrases "being equal", "being the same", "being identical" and the like are stated, they may include being within 10% of an error.

In a plane parallel with the upper surface 21, the sum of the width Wm of the first mesa portion 60 and the gate trench width Wg may be equal to the sum of the interval Wff between the adjacent floating regions 17 in the Y-axis direction and a floating region width Wf. Furthermore, in a plane parallel with the upper surface 21, the floating region width Wf of the floating region 17 of the gate trench portion 40 in the array direction may be equal to the gate trench width Wg of the gate trench portion 40 in the array direction. By making the floating region width Wf equal to the gate trench width Wg, the floating region 17 can be fabricated at a mask width same as that of the gate trench portion 40.

As shown in FIG. 7, floating regions 17 may not exist in at least a part below the emitter regions 12 that are provided in the second mesa portion 62, in the depth direction of the semiconductor substrate 10. In addition, in the depth direction of the semiconductor substrate 10, floating regions 17 may not exist below the contact holes 54 that are formed on the interlayer dielectric films 38 provided on the semiconductor substrate 10. Moreover, the floating region 17 may be positioned at shallower depth than a gate depth Wgd from the upper surface 21 to the bottom portion of the gate trench portion 40. Also, the interval Wff between adjacent floating regions 17 in the Y-axis direction may be smaller than the floating region width Wf. By providing the floating regions 17 of the present example as described above, electric field strength at an OFF state can be distributed uniformly, similar to the case in which the dummy trench portions 30 are formed, thus breakdown voltage degradation is prevented.

Figure 8:
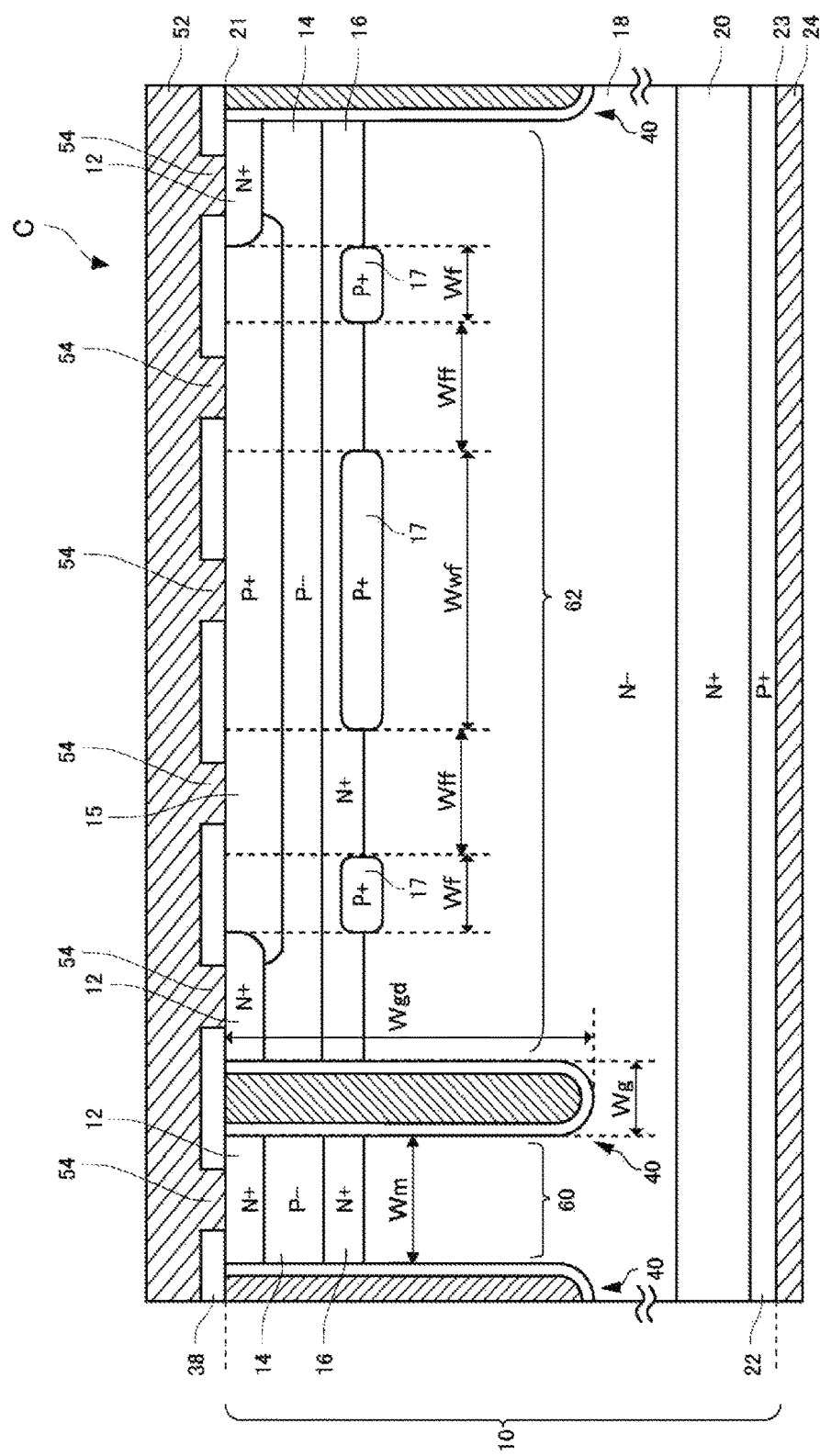
FIG. 8 is a diagram illustrating another example of the region C in FIG. 4.

FIG. 8 is a diagram illustrating another example of the region C in FIG. 4. In a plane parallel with an upper surface 21, a semiconductor device 100 shown in FIG. 8 has a width Wwf of the floating region 17 positioned on the center side of a second mesa portion 62 in the Y-axis direction, which is larger than the floating region width Wf of the floating region 17 closest to the gate trench portion 40 in the Y-axis direction.

By making the floating region width Wwf of the floating region 17 that is positioned at the center of the second mesa portion 62 larger than the floating region width Wf of the floating region 17 closest to the gate trench portion 40, holes can be extracted more successfully from the lower surface 23 side. Thus, a tradeoff of an ON voltage and turn-off loss can have a more favorable relation. Also, turn-on loss caused by holes being extracted to emitter regions 12 from P type inversion layers can be suppressed. Furthermore, by virtue of the floating regions 17 of the present example, electric field strength can be distributed uniformly and breakdown voltage degradation is prevented.

Figure 9:
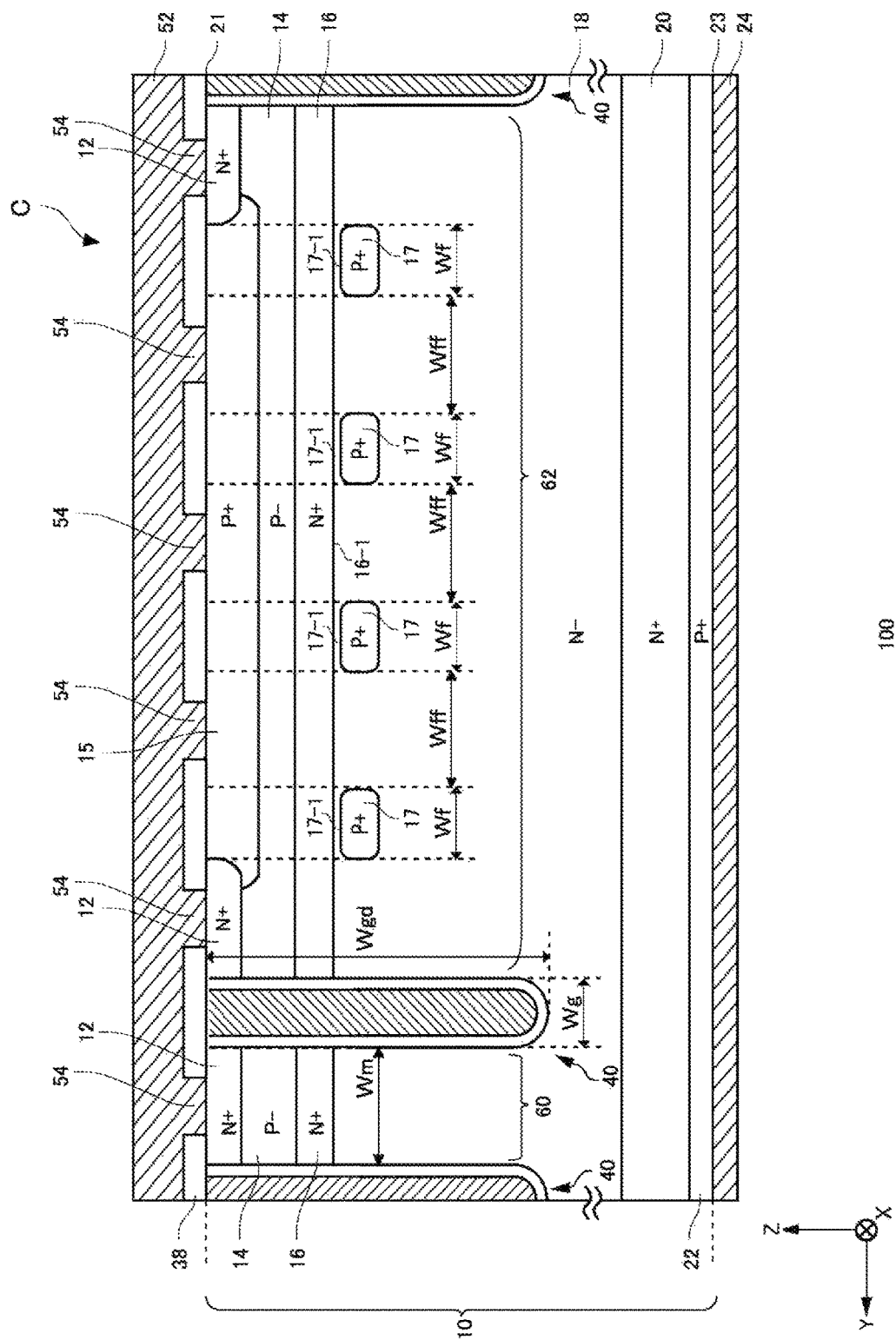
FIG. 9 is a diagram illustrating another example of the region C in FIG. 4.

FIG. 9 is a diagram illustrating another example of the region C in FIG. 4. Floating regions 17 of a semiconductor device 100 shown in FIG. 9 are provided below an accumulation region 16 in the depth direction of a semiconductor substrate 10. Here, being provided below means that upper surfaces 17-1 of the floating regions 17 in the direction parallel with an upper surface 21 are at the depth less than or equal to where lower surface 16-1 of the accumulation region 16 is formed. FIG. 9 illustrates one example in which the upper surfaces 17-1 of the floating regions 17 are provided below the lower surface 16-1 of the accumulation region 16. The lower surface 16-1 of the accumulation region 16 is a boundary that shows doping concentration five times higher than that in a base region 14. The upper surfaces 17-1 of the floating regions 17 may be provided at the same depth as the lower surface 16-1 of the accumulation region 16.

By providing the upper surfaces 17-1 of the floating regions 17 below the lower surface 16-1 of the accumulation region 16, holes can be extracted more successfully from the lower surface 23 side. Thus, a tradeoff of an ON voltage and turn-off loss can have a more favorable relation. Also, turn-on loss caused by holes being extracted to emitter regions 12 from P type inversion layers can be suppressed. Furthermore, by virtue of the floating regions 17 of the present example, electric field strength can be distributed uniformly and breakdown voltage degradation is prevented.

In addition, in a plane parallel with the upper surface 21, similar to the configuration of FIG. 8, the floating region width Wwf of the floating region 17 in the Y-axis direction, which is positioned on the center side of a second mesa portion 62 may be larger than the floating region width Wf of the floating region 17 closest to gate trench portion 40 in the Y-axis direction.

Figure 10:
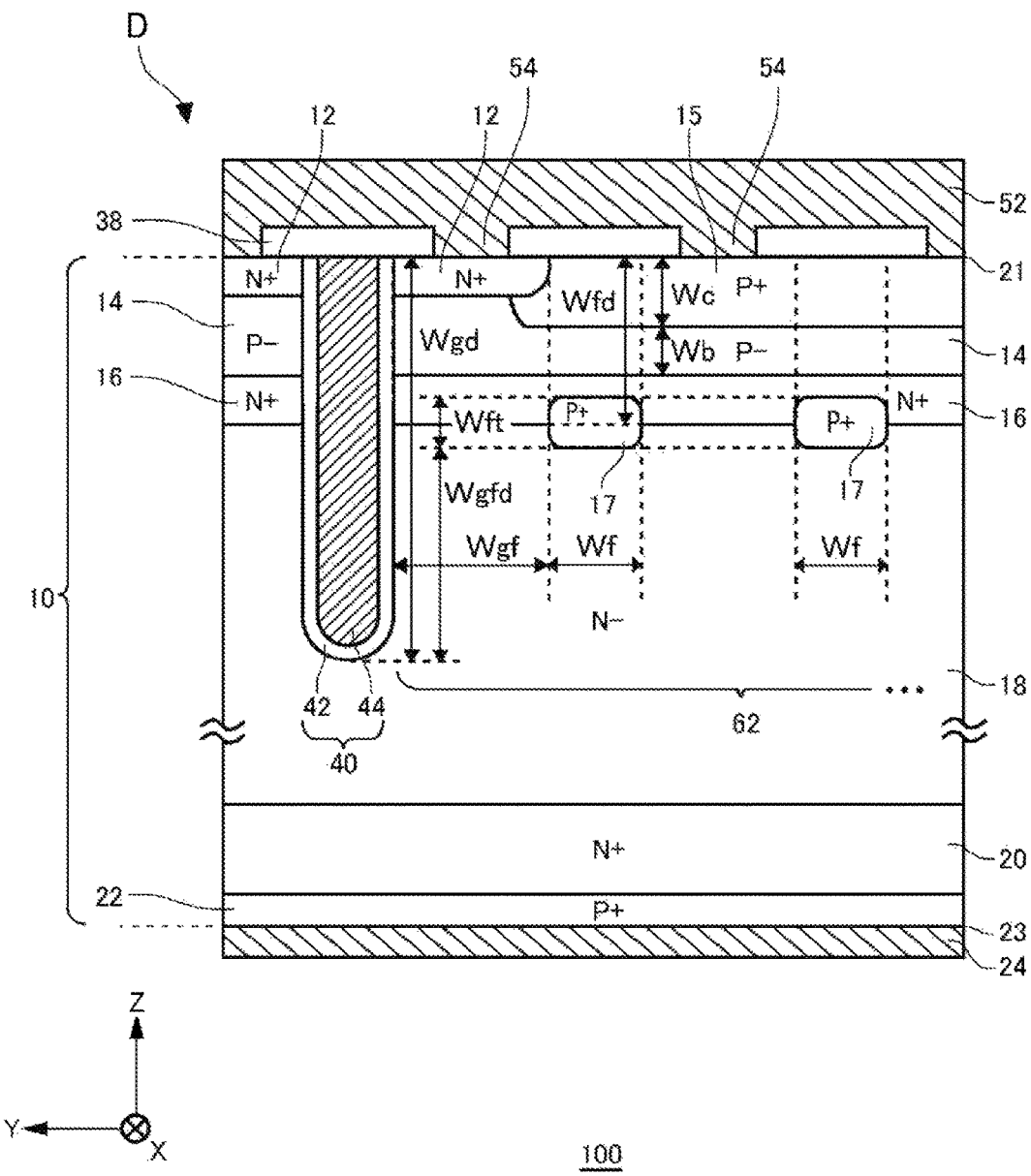
FIG. 10 is a close up view of the region D in FIG. 7.

FIG. 10 is a close up view of the region D surrounded by the dashed lines in FIG. 7. As shown in FIG. 10, width of a floating region 17 in the Z-axis direction is defined as Wft. Depth from the upper surface 21 to a peak of doping concentration of the floating region 17 in the depth direction is defined as Wfd. When a doping concentration distribution of the floating region 17 in the depth direction is uniform, Wfd may be the depth reaching to the center of the floating region 17 in the depth direction.

Distance from a side wall on the second mesa portion 62 side of the gate trench portion 40 to the floating region 17 closest to the gate trench portion 40 is defined as Wgf. Wgf may be the distance from the side wall of the gate trench portion 40 at the same depth as the floating region 17 closest to the gate trench portion 40 to the floating region 17.

Depth from the upper surface 21 to the bottom portion of the gate trench portion 40 is defined as Wgd. Difference between Wgd and depth from the upper surface 21 to the lower surface of the floating region 17 is defined as Wgfd. Depth from the upper surface 21 to the lower surface of the contact region 15 is defined as Wc. The lower surface of the contact region 15 is a boundary where the doping concentration in the second mesa portion 62 shows the equal doping concentration to the doping concentration in the base region 14 of the first mesa portion 60. In addition, depth of the base region 14 below the contact region 15 in the Z-axis direction is defined as Wb.

The depth Wgfd from the lower surface of the floating region 17 to the bottom portion of the gate trench portion 40 may be larger than the width Wft of the floating region 17 in the Z-axis direction. Also, the depth Wgfd from the lower surface of the floating region 17 to the bottom portion of the gate trench portion 40 may be larger than the distance Wgf from the side wall on the second mesa portion 62 side of the gate trench portion 40 to the floating region 17 being in direct contact with the gate trench portion 40. By making the large/small relation of Wgfd, Wft, and Wgf like this, holes can be extracted more successfully from the lower surface 23 side of the semiconductor substrate 10. Particularly, by making Wgfd a predetermined length, more extraction of holes can be achieved while increasing the carrier injection enhancement effect (IE effect). Thus, a tradeoff of an ON voltage and turn-off loss can have a more favorable relation. Also, turn-on loss caused by holes being extracted to emitter regions 12 from P type inversion layers can be suppressed. Furthermore, by virtue of the floating regions 17 of the present example, electric field strength can be distributed uniformly and breakdown voltage degradation is prevented.

Figure 11:
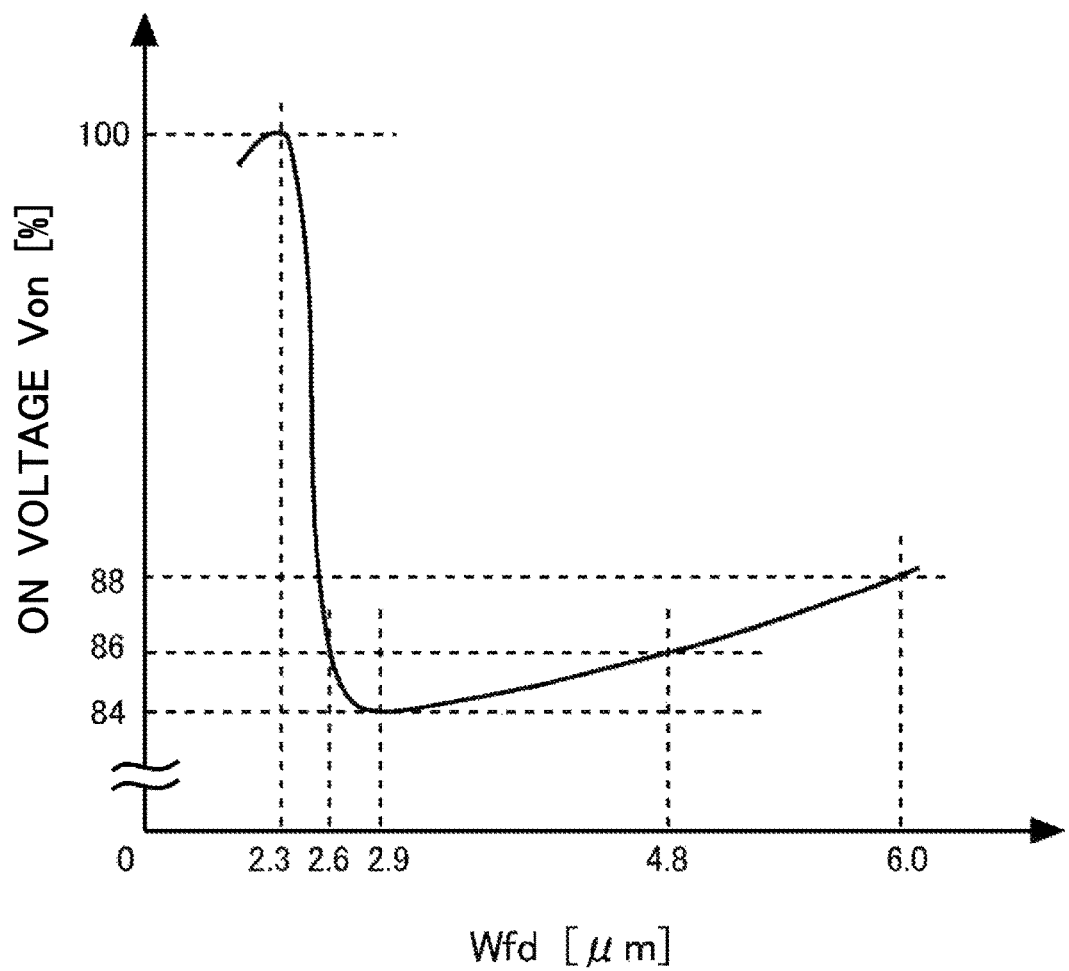
FIG. 11 is a diagram illustrating a relation between the distance Wfd and the ON voltage Von.

FIG. 11 is a diagram for simulating a relation between Wfd and an ON voltage Von of the transistor portion 70, when Wft, Wgf, Wf, Wgd, Wc, and Wb in FIG. 10 are set to 1 µm, 0.7 µm, 1.2 µm, 6.0 µm, 1.7 µm, and 1.1 µm respectively, as one example. The maximum value of the ON voltage Von is standardized as 100%, and indicated with the vertical axis. As can be seen from FIG. 11, when Wfd is 2.3 µm, the ON voltage Von indicates the maximum value. If Wfd is increased, the ON voltage Von decreases rapidly. When Wfd is 2.9 µm, the ON voltage Von indicates the minimum value. If Wfd is increased over again, the ON voltage Von increases monotonically.

In FIG. 11, when Wfd is smaller than 2.9 µm, the floating regions 17 exist at positions shallower from the upper surface 21 relative to Wgd in the Z-axis direction, and thus the accumulation region 16 is canceled by the floating regions 17. Thereby, holes concentrating at the bottom portion of the gate trench portion 40 become easy to be extracted to the floating regions 17, and the ON voltage increases. In addition, when Wfd is larger than 2.9 µm, holes concentrating at the bottom portion of the gate trench portion 40 become easy to be extracted to the floating regions 17. However, because the distance between the floating regions 17 and the emitter regions 12 become large, the hole extraction capability for the entire transistor portion 70 becomes small. Thus, hole accumulation effect is reduced and the ON voltage Von gets large. As can be seen from FIG. 11, when Wfd is between 2.6 µm and 4.8 µm inclusive, the ON voltage Von can be increased up to 2%, inclusive, from the minimum value.

Figure 12:
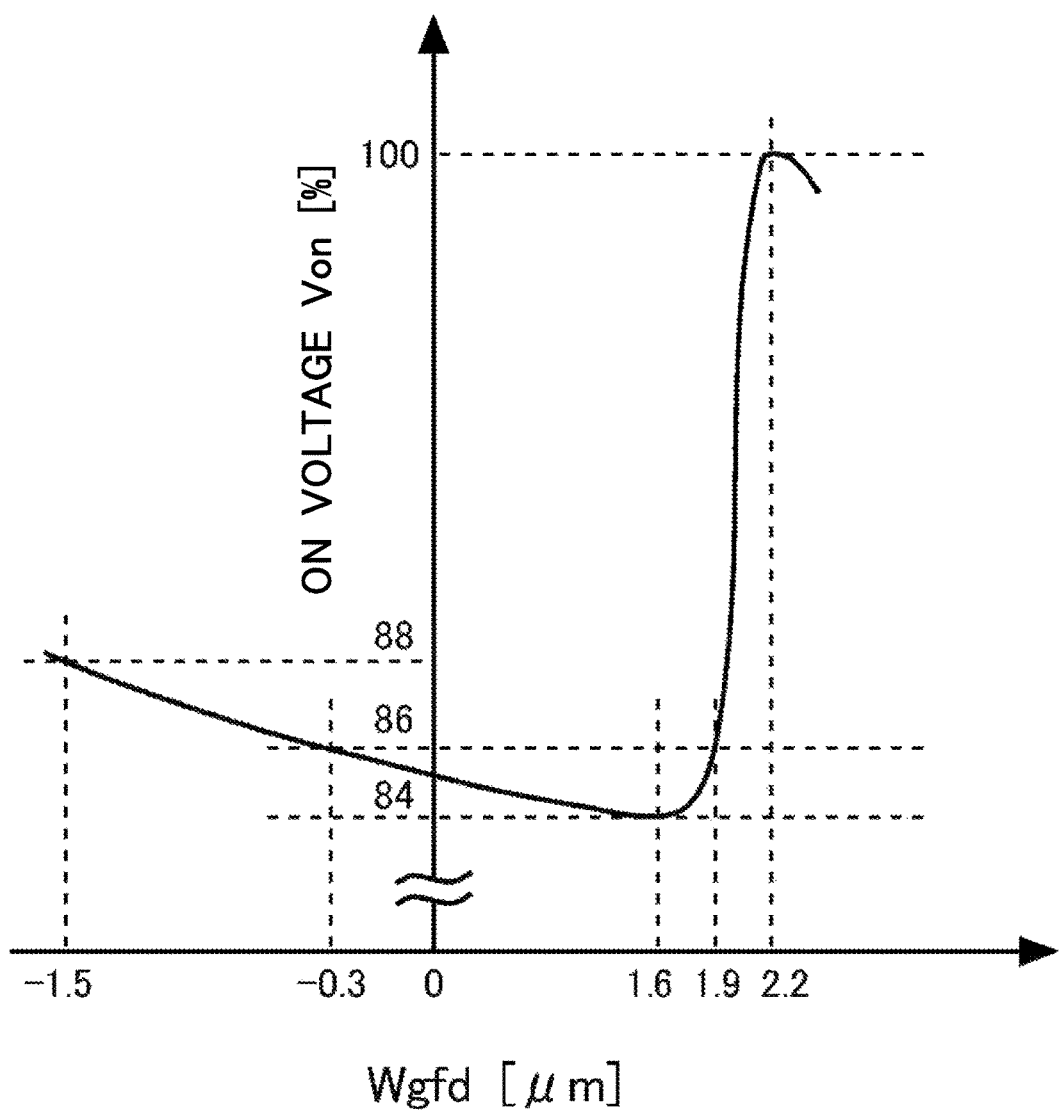
FIG. 12 is a diagram illustrating a relation between the distance Wgfd and the ON voltage Von.

FIG. 12 is a diagram showing Wfd in FIG. 11 that is converted to the distance Wgfd from the lower surface of the floating region 17 to the bottom portion of the gate trench portion 40. As can be seen from FIG. 12, when Wgfd is 2.2 µm, the ON voltage Von indicates the maximum value. If Wgfd is reduced, the ON voltage Von decreases rapidly. When Wgfd is 1.6 µm, the ON voltage Von indicates the minimum value. If Wgfd is reduced over again, Wgfd increases monotonically. As can be seen from FIG. 12, if converted to Wgfd, when Wgfd is between −0.3 µm and 1.9 µm inclusive, the ON voltage Von can be increased up to 2%, inclusive, from the minimum value. Here, the negative value indicates a case in which the floating region 17 is positioned deeper than the bottom portion of the gate trench portion 40. Speaking of the depth from the lower surface of the floating region 17 to the gate trench portion 40, when Wgfd is less than or equal to 1.9 µm, the ON voltage Von can be increased up to 2%, inclusive, from the minimum value.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an device, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A semiconductor device comprising:
    a first conductivity type drift region formed on a semiconductor substrate;
    a gate trench portion provided reaching from an upper surface of the semiconductor substrate to an inner part of the semiconductor substrate and provided extending in a predetermined extending direction from the upper surface;
    a first mesa portion being in direct contact with one of two side walls of the gate trench portion;
    a second mesa portion being in direct contact with an opposite side of the one of two side walls of the gate trench portion;
    a first conductivity type accumulation region having doping concentration higher than that in the drift region, which is provided being in direct contact with the gate trench portion above the drift region;
    a second conductivity type base region provided being in direct contact with the gate trench portion above the accumulation region;
    a first conductivity type emitter region having doping concentration higher than that in the drift region, which is provided on the upper surface of the semiconductor substrate such that it is in direct contact with the one of two side walls of the gate trench portion in at least the first mesa portion; and
    an electrically floating second conductivity type floating region provided below the base region in the second mesa portion and at a position shallower than a bottom of the gate trench portion.

2. The semiconductor device according to claim 1, wherein a width of the second mesa portion in an array direction perpendicular to the extending direction is larger than a width of the first mesa portion in the array direction.

3. The semiconductor device according to claim 2, wherein a plurality of the floating regions are provided in the array direction.

4. The semiconductor device according to claim 3, wherein the plurality of the floating regions are provided at a same interval as the width of the first mesa portion in the array direction.

5. The semiconductor device according to claim 2, wherein a width of the floating region in the array direction is equal to a width of the gate trench portion in the array direction of the gate trench portion.

6. The semiconductor device according to claim 2, wherein
    a sum of the width of the first mesa portion and the width of the gate trench portion in the array direction is equal to a sum of an interval between one floating region among a plurality of the floating regions and another one of the plurality of floating regions adjacent to the one floating region in the array direction, and the width of the one floating region in the array direction.

7. The semiconductor device according to claim 2, wherein among a plurality of the floating regions, a width of a floating region positioned on a center side of the second mesa portion in the array direction is larger than a width of a floating region closest to the gate trench portion in the array direction.

8. The semiconductor device according to claim 1, wherein the floating region is provided below the accumulation region in a depth direction of the semiconductor substrate.

9. The semiconductor device according to claim 1, wherein the floating region is provided at a depth between 2.6 µm and 4.8 µm inclusive from the upper surface of the semiconductor substrate in a depth direction of the semiconductor substrate.

10. The semiconductor device according to claim 1, wherein the floating region is provided such that a depth from a lower surface of the floating region to a bottom of the gate trench portion is less than or equal to 1.9 µm in a depth direction of the semiconductor substrate.

11. A semiconductor device comprising:
   a first conductivity type drift region formed on a semiconductor substrate;
   a gate trench portion provided reaching from an upper surface of the semiconductor substrate to an inner part of the semiconductor substrate and provided extending in a predetermined extending direction from the upper surface;
   a first mesa portion being in direct contact with one of two side walls of the gate trench portion;
   a second mesa portion being in direct contact with an opposite side of the one of two side walls of the gate trench portion;
   a first conductivity type accumulation region having doping concentration higher than that in the drift region, which is provided being in direct contact with the gate trench portion above the drift region;
   a second conductivity type base region provided being in direct contact with the gate trench portion above the accumulation region;
   a first conductivity type emitter region having doping concentration higher than that in the drift region, which is provided on the upper surface of the semiconductor substrate such that it is in direct contact with the one of two side walls of the gate trench portion in at least the first mesa portion;
   an electrically floating second conductivity type floating region provided below the base region in the second mesa portion and spaced from the gate trench portion; and
   a first conductivity type emitter region having doping concentration higher than that in the drift region, which is provided on the upper surface of the semiconductor substrate in the second mesa portion, such that it is in direct contact with the other of the two side walls of the gate trench portion, wherein
   the floating region does not exist in at least a part below the emitter region provided in the second mesa portion, in a depth direction of the semiconductor substrate.

12. A semiconductor device comprising:
   a first conductivity type drift region formed on a semiconductor substrate;
   a gate trench portion provided reaching from an upper surface of the semiconductor substrate to an inner part of the semiconductor substrate and provided extending in a predetermined extending direction from the upper surface;
   a first mesa portion being in direct contact with one of two side walls of the gate trench portion;
   a second mesa portion being in direct contact with an opposite side of the one of two side walls of the gate trench portion;
   a first conductivity type accumulation region having doping concentration higher than that in the drift region, which is provided being in direct contact with the gate trench portion above the drift region;
   a second conductivity type base region provided being in direct contact with the gate trench portion above the accumulation region;
   a first conductivity type emitter region having doping concentration higher than that in the drift region, which is provided on the upper surface of the semiconductor substrate such that it is in direct contact with the one of two side walls of the gate trench portion in at least the first mesa portion;
   an electrically floating second conductivity type floating region provided below the base region in the second mesa portion and spaced from the gate trench portion; and
   an interlayer dielectric film formed on the semiconductor substrate, wherein
   the interlayer dielectric film has a contact hole, and
   the floating region does not exist below the contact hole in the second mesa portion in a depth direction of the semiconductor substrate.

* * * * *